US008610113B2

(12) United States Patent
Hartmann et al.

(10) Patent No.: US 8,610,113 B2
(45) Date of Patent: Dec. 17, 2013

(54) MATERIAL FOR A HOLE TRANSPORT LAYER WITH P-DOPANT

(75) Inventors: David Hartmann, Erlangen (DE); Sabine Szyszkowski, Dachsbach (DE); Anna Maltenberger, Leutenbach (DE); Wiebke Sarfert, Herzogenaurach (DE); Günter Schmid, Hemhofen (DE); Riikka Suhonen, Oulu (FI)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/321,762

(22) PCT Filed: May 5, 2010

(86) PCT No.: PCT/EP2010/056094
§ 371 (c)(1),
(2), (4) Date: Feb. 6, 2012

(87) PCT Pub. No.: WO2010/133449
PCT Pub. Date: Nov. 25, 2010

(65) Prior Publication Data
US 2012/0146006 A1    Jun. 14, 2012

(30) Foreign Application Priority Data
May 20, 2009    (DE) .......................... 10 2009 022 117

(51) Int. Cl.
| H01L 51/30 | (2006.01) |
| H01L 51/54 | (2006.01) |
| H01L 51/40 | (2006.01) |
| H01L 51/46 | (2006.01) |
| H01B 1/22  | (2006.01) |

(52) U.S. Cl.
USPC .... 257/40; 257/E51.026; 438/99; 252/519.33

(58) Field of Classification Search
None
See application file for complete search history.

(56) References Cited

U.S. PATENT DOCUMENTS

| 6,074,791 | A  | * | 6/2000  | Jennings et al. | ............. 430/58.8 |
| 6,361,885 | B1 | * | 3/2002  | Chou            | ............. 428/690 |
| 8,330,148 | B2 | * | 12/2012 | Schmid et al.   | ............. 257/40 |
| 8,343,636 | B2 | * | 1/2013  | Jen et al.      | ............. 428/690 |
| 2002/0017612 | A1 | * | 2/2002 | Yu et al.      | ............. 250/370.11 |
| 2002/0182441 | A1 | * | 12/2002 | Lamansky et al. | ............. 428/690 |

(Continued)

FOREIGN PATENT DOCUMENTS

| DE | 102007002420 | 7/2008 |
| DE | 102007023876 | 9/2008 |

OTHER PUBLICATIONS

Cleland, Deidre, M., Garth Irwin, Pawel Wagner, David L. Officer, and Keith C. Gordon. "Linker Conjugation Effects in Rhenium(I) Bifunctional Hole-Transport/Emitter Molecules." Chemistry—A European Journal 15.15 (2009): 3682-690.*

Radka Baková, Majed Chergui, Chantal Daniel, Antonín Vlček Jr., Stanislav Záliš, Relativistic effects in spectroscopy and photophysics of heavy-metal complexes illustrated by spin-orbit calculations of [Re(imidazole)(CO)3(phen)]+, Coordination Chemistry Reviews, vol. 255, Issues 7-8, Apr. 2011, pp. 975-989.*

So, Franky, Benjamin Krummacher, Mathew K. Mathai, Dmitry Poplayskyy, Stelios A. Choulis, and Vi-En Choong. "Recent Progress in Solution Processable Organic Light Emitting Devices." Journal of Applied Physics 102.9 (2007): 091101.*

(Continued)

*Primary Examiner* — Thomas L Dickey
*Assistant Examiner* — Joseph Schoenholtz
(74) *Attorney, Agent, or Firm* — Staas & Halsey LLP

(57) ABSTRACT

A material for a hole transport layer has a p-dopant. The dopant forms with the hole transport material a charge transfer complex. A metal component in solution is processed with the hole transport matrix material in solution to form the hole transport layer.

14 Claims, 13 Drawing Sheets

(56) References Cited

U.S. PATENT DOCUMENTS

| | | | |
|---|---|---|---|
| 2004/0056180 A1* | 3/2004 | Yu | 250/214.1 |
| 2005/0230665 A1* | 10/2005 | Thompson | 252/500 |
| 2006/0232200 A1 | 10/2006 | Ookawa et al. | |
| 2006/0292394 A1* | 12/2006 | Iwaki et al. | 428/690 |
| 2007/0001166 A1* | 1/2007 | Tao et al. | 257/40 |
| 2007/0063156 A1* | 3/2007 | Hayashi | 250/559.07 |
| 2007/0141396 A1* | 6/2007 | Chun et al. | 428/690 |
| 2008/0145520 A1* | 6/2008 | Yumoto | 427/66 |
| 2009/0050882 A1* | 2/2009 | Okuyama et al. | 257/40 |
| 2009/0140955 A1* | 6/2009 | Nakamura et al. | 345/76 |
| 2009/0206742 A1* | 8/2009 | Oda et al. | 313/504 |
| 2009/0243475 A1* | 10/2009 | Shoda et al. | 313/504 |
| 2010/0059740 A1 | 3/2010 | Yersin et al. | |
| 2010/0062281 A1* | 3/2010 | Cordonier et al. | 428/702 |
| 2010/0084639 A1* | 4/2010 | Schmid et al. | 257/40 |
| 2010/0084647 A1* | 4/2010 | Kondakova et al. | 257/40 |
| 2010/0247923 A1* | 9/2010 | Hsu | 428/419 |

OTHER PUBLICATIONS

Woolf, A. A. "An Outline of Rhenium Chemistry." Q. Rev. Chem. Soc. 15 (1961): 372-91.*

Crosby, G. A., K. W. Hipps, and W. H. Elfring. "Appropriateness of Assigning Spin Labels to Excited States of Inorganic Complexes." Journal of the American Chemical Society 96.2 (1974): 629-30.*

Dae-Ho Kim, Tae-Min Kim, Won-Ik Jeong, and Jang-Joo Kim, "Rhenium oxide as an efficient p-dopant to overcome S-shaped current density-voltage curves in organic photovoltaics with a deep highest occupied molecular orbital level donor layer", Appl. Phys. Lett. 101, 153303 (2012).*

Hamwi, S., J. Meyer, T. Winkler, T. Riedl, and W. Kowalsky. "P-type Doping Efficiency of MoO[sub 3] in Organic Hole Transport Materials." Applied Physics Letters 94.25 (2009): 253307.*

Jwo-Huei Jou, Pei-Yu Hwang, Wei-Ben Wang, Cheng-Wei Lin, Yung-Cheng Jou, Yu-Lin Chen, Jing-Jong Shyue, Shih-Ming Shen, Sun-Zen Chen, High-efficiency low color temperature organic light emitting diodes with solution-processed emissive layer, Organic Electronics, vol. 13, Issue 5, May 2012, pp. 899-904.*

Jae-Hyun Lee, Hyun-Mi Kim, Ki-Bum Kim, Ryota Kabe, Pavel Anzenbacher et al.,"Homogeneous dispersion of organic p-dopants in an organic semiconductor as an origin of high charge generation efficiency", Appl. Phys. Lett. 98, 173303 (2011).*

Sujie Chen, Junsheng Yu, Wen Wen, Yadong Jiang, "Efficiency improvement of yellow organic light-emitting devices by using mixed hole transporting layer", 5th International Symposium on Advanced Optical Manufacturing and Testing Technologies: Optoelectronic Materials and Devices for Detector, Imager, Display, and Energy Conversion Technology, edited.*

Yan Shao, Xiong Gong, Alan J. Heeger, Michelle Liu, and Alex K.-Y. Jen, Long-Lifetime Polymer Light-Emitting Electrochemical Cells Fabricated with Crosslinked Hole-Transport Layers, Adv. Mater. 2009, 21, 1972-1975.*

J. Kido, K. Hongawa, K. Okuyama, and K. Nagai, White lightemitting organic electroluminescent devices using the poly(Nvinylcarbazole) emitter layer doped with three fluorescent dyes, Appl. Phys. Lett. 64, 815 (1994).*

Ruben D. Costa, Enrique Orti, Henk J. Bolink, Filippo Monti, Gianluca Accorsi, and Nicola Armaroli, "Luminescent Ionic Transition-Metal Complexes forLight-Emitting Electrochemical Cells", Angew. Chem. Int. Ed. 2012, 51, 8178-8211.*

Liu, H.M., High-efficiency polymer electrophosphorescent diodes based on an Ir (III) complex, Appl. Phys. Lett. 87, 221103 (2005).*

Niu, Y.H., High-efficiency light-emitting diodes using neutral surfactants and aluminum cathode,Appl. Phys. Lett. 86, 083504 (2005).*

Ouyang, J., Guo, T.-F., Yang, Y., Higuchi, H., Yoshioka, M. and Nagatsuka, T. (2002), High-Performance, Flexible Polymer Light-Emitting Diodes Fabricated by a Continuous Polymer Coating Process. Adv. Mater., 14: 915-918.*

Suzuki M.,Highly efficient polymer light-emitting devices using ambipolar phosphorescent polymers, Appl. Phys. Lett. 86, 103507 (2005).*

Shin-Rong Tseng, Multilayer polymer light-emitting diodes by blade coating method , Appl. Phys. Lett. 93, 153308 (2008).*

X. H. Yang and D. Neher, Polymer electrophosphorescence devices with high power conversion efficiencies, Appl. Phys. Lett., vol. 84, No. 14, Apr. 5, 2004.*

Youn Chan Yim, Enhanced light emission from one-layered organic light-emitting devices doped with organic salt by simultaneous thermal and electrical annealing, Appl. Phys. Lett. 89, 103507 (2006).*

Lumtec Hole Transport Product Catalog downloaded from URL<http://www.lumtec.com.tw/pdf/OLED.pdf> on Jan. 22, 2013.*

Yao, Yan, Jianhui Hou, Zheng Xu, Gang Li, and Yang Yang. "Effects of Solvent Mixtures on the Nanoscale Phase Separation in Polymer Solar Cells." Advanced Functional Materials 18.12 (2008): 1783-789.*

C. D. Müller, et al., "Multi-colour organic light-emitting displays by solution processing," Nature, 421, pp. 829-833 (2003).

Xiong Gong, et al., "Multilayer Polymer Light-Emitting Diodes: White-Light Emission with High Efficiency," Advanced Materials, 17, 2053-2058 (2005).

Shin-Rong Tseng et al., "General method to solution-process multilayer polymer light-emitting diodes," Applied Physics Letters, 88, 163501, 3 pages (2006).

M. P. de Jong et al., "Stability of the interface between indium-tin-oxide and poly(3,4-ethylenedioxythiophene)/poly(styrenesulfonate) in polymer light-emitting diodes," Applied Physics Letters, 77, No. 14, 2255-2257 (2000).

Rizwan U. A. Khan et al., "Degradation in blue-emitting conjugated polymer diodes due to loss of ohmic hole injection," Applied Physics Letters, 84, No. 6, 921-923 (2004).

M. Kemerink et al., "Three-dimensional inhomogeneities in PEDOT:PSS Films," Journal of Physical Chemistry B, 108, 18820-18825 (2004).

P. J. Brewer et al., "Influence of poly(3,4-ethylenedioxythiophene)-poly(styrenesulfonate) in polymer LEDs," Physical Review B, 74, 115202, 6 pages (2006).

Xin Xu et al., "Mechanisms for current-induced conductivity changes in a conducting polymer," Applied Physics Letters, 89, 142109, 3 pages (2006).

Toshinori Matsushima et al., "Enhanced hole injection and transport in molybdenum-dioxide-doped organic hole-transporting layers," Journal of Applied Physics, 103, 034501, 8 pages (2008).

Hisao Ikeda et al., "P-185: Low-Drive-Voltage OLEDs with a Buffer Layer Having Molybdenum Oxide," SID Digest 06, P-185, 923-926 (2006).

Chan-Ching Chang et al., "17.4: Highly Power Efficient Organic Light-Emitting Diodes with a Novel P-Doping Layer" SID Digest 06, 17.4, 1106-1109 (2006).

Dong-Seok Leem et al., "Low driving voltage and high stability organic light-emitting diodes with rhenium oxide-doped hole transporting layer," Applied Physics Letters, 91, 011113, 3 pages (2007).

Jiang Wu et al., "Efficient top-emitting organic light-emitting diodes with a $V_2O_5$ modified silver anode," Semiconductor Science and Technology, 22, 824-826 (2007).

Lehrbuch der Anorganischen Chemie, A. F. Hollemann, E. Wiberg. ISBN 3-11-005962-2; 81.-90. Auflage, 7 pages, 1976.

Anorganisch Chemisches Institut der Technischen Universität München; Dissertation Fritz Elmer Kühn Nov. 29, 1995 Organorheniumoxid—Synthesen, Eigenschaften und Abbauwege, 19 pages.

Xinwen Zhang et al., "Solution-processed p-doped hole-transport layer and its application in organic light-emitting diodes," Applied surface science, 256, No. 14, 4468-4472 (2010).

* cited by examiner

→□— p-TBD: ReOx 0% (reference)
--○-- p-TBD: ReOx 5%
⋯△⋯ p-TBD: ReOx 10%
—▽-- p-TBD: ReOx 20%

■ 120nm p-TPD: ReOx in CB/CB
○ 120nm p-TPD: ReOx in CB/THF

MATERIAL FOR A HOLE TRANSPORT LAYER WITH P-DOPANT

CROSS REFERENCE TO RELATED APPLICATIONS

This application is based on and hereby claims priority to International Application No. PCT/EP2010/056094 filed on May 5, 2010 and German Application No. 10 2009 022 117.4 filed on May 20, 2009, the contents of which are hereby incorporated by reference.

BACKGROUND

The invention relates to a material for a hole transport layer with a p-doping agent.

It is known that the efficiency, for example expressed in cd/A or lm/W, and the lifetime (in hours) of organic light emitting diodes can be increased by introducing special layers for electron or hole transport. Since the layers are processed from solution, the solubility of the materials in particular is a basic prerequisite for their applicability.

Hole transport layers for polymer-based organic light emitting diodes are mostly produced from an aqueous solution of poly(3,4-ethylenedioxythiophene) doped with polystyrene sulfonic acid (PEDOT:PSS).

It has however become evident that this material has disadvantages. Firstly, the highly acidic sulfonic acid it contains etches the electrode layer lying beneath which as a general rule is formed of ITO (indium tin oxide), and secondly it is known that the boundary surface between the light-emitting layer and the hole transport layer formed of PEDOT:PSS has too short a service life for economic applications.

SUMMARY

One potential object is to create a dopant for a hole transport layer which overcomes the disadvantages of the related art.

The inventors propose a material for a hole transport layer, comprising a matrix material and a doping agent, wherein the matrix material with the doping agent can be processed from solution and forms a charge transfer complex having at least one metal center, on which the positive charge which is transported through the layer is stabilized.

"Processable from solution" in this context basically means that the work step for applying the hole transport layer does not take place by way of deposition in a vacuum, such as for example in a molecular pump vacuum, but by way of wet chemical work steps with a considerably lower resource requirement. In particular, provision is made such that the hole transport layer can be produced by simple wet chemical methods, and taking place under normal conditions, in other words by spin coating, spraying, spinning on or printing, for example by way of doctor blading, gravure printing, inkjet printing, flexo printing or offset printing.

Materials which are capable of hole transport and can therefore be used for stabilizing positive charges are in particular used as a matrix. Alongside many others the following are examples of polymeric hole transporters (high molecular weight): PEDOT (poly-(3,4-ethylenedioxythiophene), polyvinylcarbazole (PVK), poly(N,N'-bis, (4-butylphenyl)-N,N'-bis(phenyl)benzidine (PTPD), polyaniline (PANI) and poly (3-hexylthiophene) (P3HT). From these materials, any desired copolymers and/or block copolymers, which can also contain "isolating" but for example solubilizing units, can be used. Examples thereof are polystyrene, ABS, ethylene units, vinyl units etc.

Hole transporters having a low molecular weight, so-called small molecules, can likewise be used.

Various examples of hole transporters having a low molecular weight are listed in the following:
N,N'-bis(naphthalen-1-yl)-N,N'-bis(phenyl)-9,9-dimethylfluorene
N,N'-bis(3-methylphenyl)-N,N'-bis(phenyl)-9,9-diphenylfluorene
N,N'-bis(naphthalen-1-yl)-N,N'-bis(phenyl)-9,9-diphenylfluorene
N,N'-bis(naphthalen-1-yl)-N,N'-bis(phenyl)-2,2-dimethylbenzidine
N,N'-bis(3-methylphenyl)-N,N'-bis(phenyl)-9,9-spirobifluorene
2,2',7,7'-tetrakis(N,N-diphenylamino)-9,9'-spirobifluorene
N,N'-bis(naphthalen-1-yl)-N,N'-bis(phenyl)-benzidine
N,N'-bis(naphthalen-2-yl)-N,N'-bis(phenyl)-benzidine
N,N'-bis(3-methylphenyl)-N,N'-bis(phenyl)-benzidine
N,N'-bis(3-methylphenyl)-N,N'-bis(phenyl)-9,9-dimethylfluorene
N,N'-bis(naphthalen-1-yl)-N,N'-bis(phenyl)-9,9-spirobifluorene
Di-[4-(N,N-ditolyl-amino)-phenyl]cyclohexane
2,2',7,7'-tetra(N,N-di-tolyl)amino-spiro-bifluorene
9,9-bis[4-(N,N-bis-biphenyl-4-yl-amino)phenyl]-9H-fluorene
2,2',7,7'-tetrakis[N-naphthalenyl(phenyl)-amino]-9,9-spirobifluorene
2,7-bis[N,N-bis(9,9-spiro-bifluorene-2-yl)-amino]-9,9-spirobifluorene
2,2'-bis[N,N-bis(biphenyl-4-yl-amino]-9,9-spirobifluorene
N,N'-bis(phenanthren-9-yl)-N,N'-bis(phenyl)-benzidine
N,N,N',N'-tetra-naphthalen-2-yl-benzidine
2,2'-bis(N,N-di-phenyl-amino)-9,9-spirobifluorene
9,9-bis[4-(N,N-bis-naphthalen-2-yl-amino)phenyl]-9H-fluorene
9,9-bis[4-(N,N'-bis-naphthalen-2-yl-N,N'-bis-phenyl-amino)-phenyl]-9H-fluorene
Titanium oxide phthalocyanine
Copper phthalocyanine
2,3,5,6-tetrafluoro-7,7,8,8,-tetracyano-quinodimethane
4,4',4''-tris(N-3-methylphenyl-N-phenyl-amino)triphenylamine
4,4',4''-tris(N-(2-naphthyl)-N-phenyl-amino)triphenylamine
4,4',4''-tris(N-(1-naphthyl)-N-phenyl-amino)triphenylamine
4,4',4''-tris(N,N-diphenyl-amino)triphenylamine
Pyrazino[2,3-f][1,10]phenanthroline-2,3-dicarbonitrile
N,N,N',N'-tetrakis(4-methoxyphenyl)benzidine
2,7-bis[N,N-bis(4-methoxy-phenyl)amino]-9,9-spirobifluorene
2,2'-bis[N,N-bis(4-methoxy-phenyl)amino]-9,9-spirobifluorene
N,N'-di(naphthalen-2-yl)-N,N'-diphenylbenzene-1,4-diamine
N,N'-di-phenyl-N,N'-di-[4-(N,N-di-tolyl-amino)phenyl] benzidine
N,N'-di-phenyl-N,N'-di-[4-(N,N-di-phenyl-amino)phenyl] benzidine.

The hole transporters can be used alone or in combination. In this situation, it has become apparent that a mixture of compounds having a high and a low molecular weight exhibits advantages with regard to the film formation. Material proportions of a higher molecular weight in the formulation improve the planarization capability thereof. A preferred combination is the mixture of PTPD and N'-diphenyl-N,N'-bis[1-naphthyl-1,1'-biphenyl]-4,4'-diamine (NPB). The mixture proportions can be varied within wide ranges between 0 and 100%, in relation to the overall proportion of hole transporters.

A hole transport layer can be used in all organic electronic components such as transistors, diodes, capacitors, solar cells, photodiodes, electrochromic and self-emitting components. For example, it has already been used with great success in self-emitting devices.

A self-emitting organic electronic device is primarily a light emitting diode. Such an organic light emitting diode basically has the following structure: A lower electrode layer, which is transparent, is situated on a transparent substrate. Above the lower electrode layer is situated the actually active emitting layer and above this the second electrode. In order to give improved performance, intermediate layers are incorporated between the two electrodes and the organic active layer.

The hole transport layer is one of these intermediate layers, through which holes or positive charges are transported from the electrode to the emitting layer. The material for forming the hole transport layer comprises a solvent, a matrix which is present dissolved in the solvent, and a p-doping agent which enhances the suitability of the material to act as a hole conductor.

Metal compounds which originate from relatively large metal ions, in particular those of the higher transition metal groups, are first and foremost suitable as p-doping agents. In particular, the metal oxides are suited on account of their strongly Lewis acid character for increasing the number of free holes in the hole conductor matrix.

Examples of this type are known from the literature, such as molybdenum oxide ($MoO_2$; $MoO_3$), tungsten oxide ($WO_3$), vanadium oxide ($V_2O_5$) and rhenium(VI) oxide ($ReO_5$) and rhenium(VII) oxide, the suitability of which as p-dopants can be demonstrated. In this situation, these metal compounds are applied as doping agents by vacuum deposition in vacuum systems at approx. $10^{-4}$ Pa (in other words conditions produced by turbo molecular pumps). This has an enormous resource requirement which is not applicable in the case of metal compounds processable from solution and thus the inventors proposals result in a dramatic increase in the cost-effectiveness of all the devices.

It has surprisingly now become apparent that there are possible ways of putting into solution metal compounds such as for example the rhenium heptoxide ($Re_2O_7$) together with the hole transporter matrix material and thus creating an effective p-doping agent which can be processed from solution. In this situation, on the one hand the metal compound, in other words for example the rhenium compound, can be put into solution by complexation/coordination with solvent molecules and on the other hand by complexation/coordination with the hole transporter matrix material. These two solution mechanisms can also be used in combination.

Rhenium heptoxide ($Re_2O_7$) is a relatively strong Lewis acid having a relatively low oxidizing power, in other words the tendency to oxidize other molecules is slight. This is particularly advantageous because an irreversible oxidation of the matrix material should be prevented. The rhenium heptoxide used in solution breaks down under certain circumstances during processing of the organic electronic "device", in particular during a thermolysis, possibly partially or entirely to rhenium trioxide ($Re(VI)O_3$) and/or rhenium pentoxide ($Re(V)_2O_5$).

It is therefore possible that only $ReO_3$ and/or $Re_2O_3$ can be detected in the finished product, in the hole transporter layer, although the layer has been produced wet chemically, in other words processable from solution and using rhenium heptoxide. The suitability for use as a doping agent, as shown below, is unimpaired by this breakdown. Particularly preferable is the case where the oxidation level of the rhenium does not change during the processing. Which reactions take place during the thermolysis depends very largely on the supporting solvent and/or the solvent of the formulation.

The structure of the $Re_2O_7$ in dissolved form, wherein "D" here stands for the donor groups of the solvent and/or of the hole transport matrix material, is shown in the following.

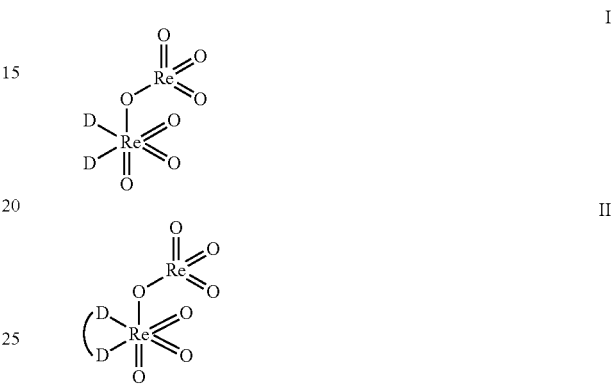

The structure I shows the simple case with a bonding of the solvent/hole transport matrix material to a free valence on the metal atom, structure II shows the case that the solvent/hole transport matrix material coordinates in polydentate fashion on the metal atom.

A similar picture results if instead of the oxides the perrhenyl carboxylates for example are used:

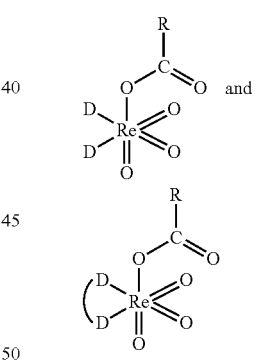

These are the presumed donor-complexed structures of the perrhenyl carboxylates. As can be seen, the charge transport material/solvent complexes on the rhenium and the carbonyl is released as an anion when a positive charge is accepted by the rhenium atom with doping of the hole transport matrix material (see Scheme 1 and 2 below). Alkyl carboxylates, such as for example acetate and propionate, heteroaryl carboxylates such as benzoate or picolinate, in each case also as wholly or partially fluorinated derivatives thereof, can be used as carboxylates.

These structural models on the rhenium atom presumably also explain that the rhenium heptoxide is readily soluble in (tetrahydrofuran) THF, dioxane, ethylene glycol dimethyl ether, acetonitrile and other solvents with donors. In addition to the rhenium heptoxide, other metal compounds which are capable of forming similar complexes can also be used.

The example of rhenium heptoxide serves to show schematically how the metal compound stabilizes the positive charge or produces the hole for the charge carrier transport on the matrix material.

vanadium oxide ($V_2O_5$) or compounds of rare earths and other metals for this purpose in order to produce metal-doped and/or in particular metal-oxide-doped formulations for hole conductor systems or hole transport layers.

Scheme 1.

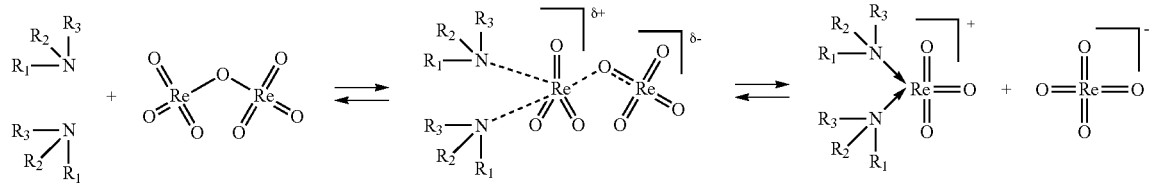

Scheme 2.

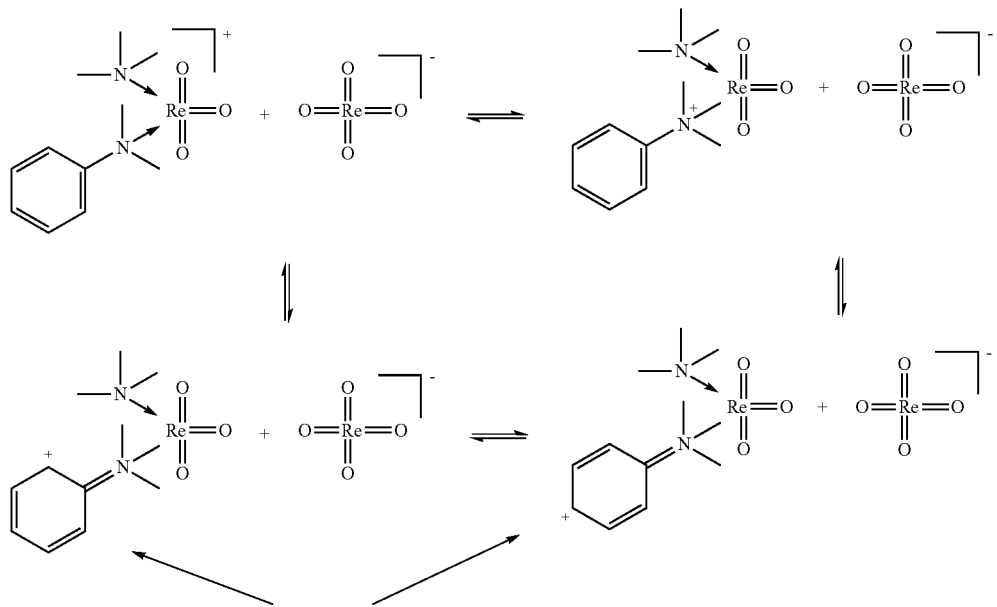

"formal" hole on the transport material

FIG. 2. The mechanism for p-doping with $Re_2O_7$ as a p-dopant

The soluble matrix materials which are used in conjunction with rhenium heptoxide are not restricted to those which exhibit a nitrogen donor function. Equally suitable are bonds with monodentate or polydentate oxygen, sulfur, selenium, phosphor, or arsenic donors. Polymers or small molecules with or without aromatic core/cores are moreover used in the basic structure. There is no restriction on polymeric matrix materials because this system of hole stabilization in the hole transport layer can also be used with regard to the "small molecules".

The ratio of the proportions of the doping agents in the material can vary; it can lie between 0.01 and 1.1 means that equal proportions of matrix material and doping agent are present. Preferred ratios lie in a range of a 1-30% proportion of doping agent.

Instead of the donor complexes of the rhenium oxide, it is also possible to use donor-complexed derivatives of the molybdenum oxide ($MoO_2$; $MoO_3$), tungsten oxide ($WO_3$), Although these materials do not normally dope quantitatively because the metal compounds, for example the rhenium oxide is already saturated by the donors D, through adept reaction control and effective displacement of the equilibrium which is always present during complex formation, these metal compounds are nevertheless successfully used as p-dopants.

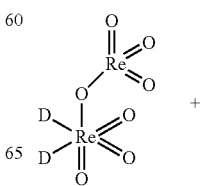

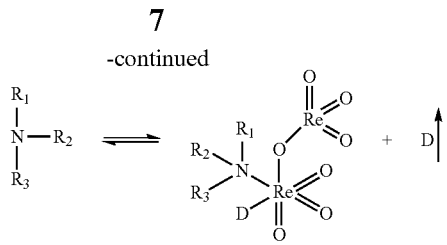

This reaction, shown here again with rhenium purely as an example, takes place in an equilibrium process such that through successive removal of the donor, which for example is part of the solvent, the equilibrium can be shifted onto the side of the charge transfer complex with the charge transporter material. In the scheme shown above, this removal is indicated by the "D" with an upward pointing arrow. The removal of the donors D can occur as a result of their being consumed by reaction, by evaporation and/or precipitation or other. For example, the donors which are likewise preferably readily volatile are removed by heating and/or evaporating the solvent. Again for the example of rhenium heptoxide, temperatures of greater than 150° C., for example between 150° C. and 250° C. may be required in this situation.

In principle, there are two possible ways of producing the doped material for the hole transport layer. Firstly, one formulation is produced as a result of dissolving the metal compound, for example the rhenium heptoxide, in a suitable donor solvent. In this situation, it has proved advantageous in the case of rhenium heptoxide that the donor solvent is used in a 2- to 10-fold molar excess. It is also possible to use a solvent mixture. Secondly, the rhenium heptoxide can be introduced, dissolved in a supporting solvent, into the solvent or solvent mixture for the reaction with the matrix material. To the finished solution of the rhenium heptoxide is then added a solution of the matrix material which can be present as a polymer or in the form of small molecules. The reaction to completion or the doping of the matrix material can be visually recognizable, for example the color of the solution can change due to the formation of the charge transfer complex. In this situation, on the metallic central atom, for example on the rhenium atom, the donor molecules of the solvent are replaced at least partially by molecules of the hole transporter material.

Visually, a pronounced color change of the solution from transparent colorless to dark green can firstly be recognized. This color change indicates the emergence of the charge transfer complex between the PVK and the rhenium heptoxide and thus the successful doping.

Secondly, the production of the doped hole transport layer can be achieved by producing a thermally labile metal complex and incorporating it into the formulation in the first instance, which then breaks down during the thermolysis to remove the solvent of the formulation processed from solution and produces the doped hole transport layer.

The hole conductor layer is created as follows after being applied: If it has not already occurred during production of the formulation, the donor complex of the rhenium heptoxide breaks down with one or more donor ligands splitting off. In this situation, the coordination points being released take up molecules of the hole conductor (matrix material).

In the preferred variant of production, the oxidation level of the rhenium does not change and a rhenium heptoxide doped hole conductor layer is produced.

Donor complexes do however exist (doctoral thesis by Fritz. E. Kühn??) where the thermolytic decomposition of the donor complex takes place with reduction of the rhenium heptoxide. In this connection, (Re(VI)O$_3$) and/or rhenium pentoxide (Re(V)$_2$O$_5$) doped hole conductor systems are produced.

The complex formation is recognizable due to a change in color with formation of a charge transfer complex.

Hole transport layers which have been produced by coevaporation of the metal compounds with the hole transport material have shown hole conductivities comparable with those produced from solution in components for characterizing the hole conductivity. The soluble metal compounds proposed by the inventors therefore also offer a cost-effective alternative production method to those processed from the vapor phase.

The following are for example used as donor-containing solvents: tetrahydrofuran (THF), toluene, ethylene glycol diethyl ether, chlorobenzene, propylene glycol methyl ether acetate, further organic and inorganic and also polar or nonpolar and solvent mixtures can also be used in the context of this discussion. In this situation, organic solvents are preferred in order that the hole transporter material, which can be present in polymeric form, oligomeric form or in the form of small molecules, is not precipitated out.

There is also the case that ReOx is formulated together with the hole transporter matrix material, in other words for example with the small molecules NMP or poly-TPD, without a further solvent, also without a donor solvent. It has been possible to show that this likewise functions.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
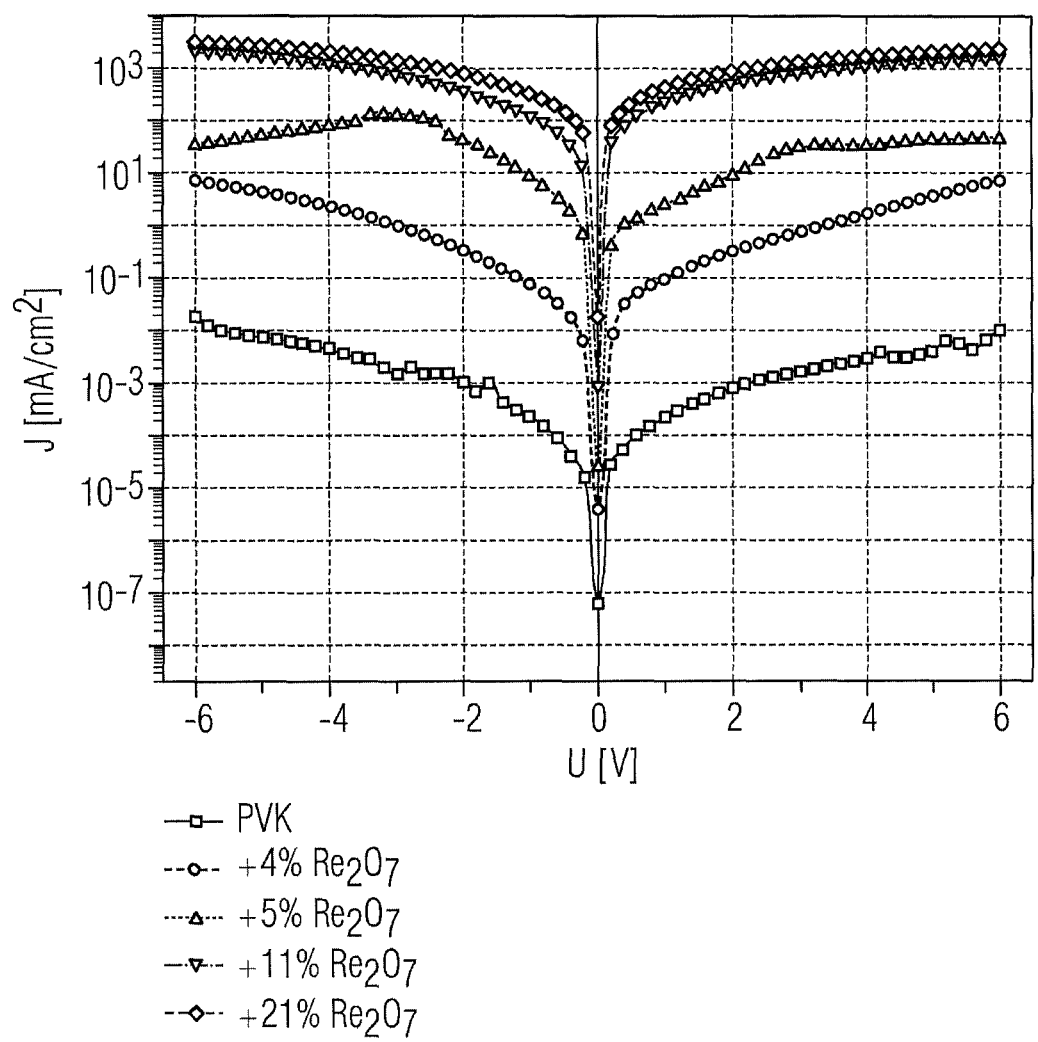
FIG. 1 shows impressively how the current/voltage curve rises towards higher current densities as the rhenium content increases.

Reference will now be made in detail to the preferred embodiments of the present invention, examples of which are illustrated in the accompanying drawings, wherein like reference numerals refer to like elements throughout.

Example 1

Rhenium heptoxide ($Re_2O_7$), dissolved in dry THF (tetrahydrofuran), is used with poly(9-vinylcarbazole) (PVK) dissolved in dry toluene under an argon atmosphere, wherein the ratio between THF and toluene is approximately 2:3. The two solutions are in the first instance stirred separately and then mixed together. This mixture is applied by spin-coating, for example at a speed of 500 rpm, on an electrode layer, for example formed of ITO (indium tin oxide), which is structured and has been washed and subjected to an RIE (reactive ion etching) process.

In this case, an approx. 100 nm thick layer is created, on which is created a further electrode, for example an aluminum electrode, which is applied thermally by a mask. This results in the presence of a PVK:$Re_2O_7$-doped hole transport layer between two electrodes (ITO and aluminum). In this situation, the ratio between PVK and rhenium heptoxide is varied in the layer in the range from 1:1 to 100:1. On this construction it is possible to measure both the hole conduction properties and also the conductivities of the respective layers. See the results in the discussion relating to FIGS. 1 to 5.

FIG. 1 shows impressively how the current/voltage curve rises towards higher current densities as the rhenium content increases. In FIG. 1 the graphs are reproduced which illustrate the measured current/voltage curves of ITO electrodes that according to Example 1 are covered by a 100 nm layer of PVK. By way of comparison, there is one measurement without doping (0% $Re_2O_7$) and with different doping concentrations. The current density at 4 volts in the pure PVK is thus approx. $10^{-2}$ mA/cm², whereas at the same voltage in the doped material (21% $Re_2O_7$) it is $10^3$ mA/cm².

Figure 2:
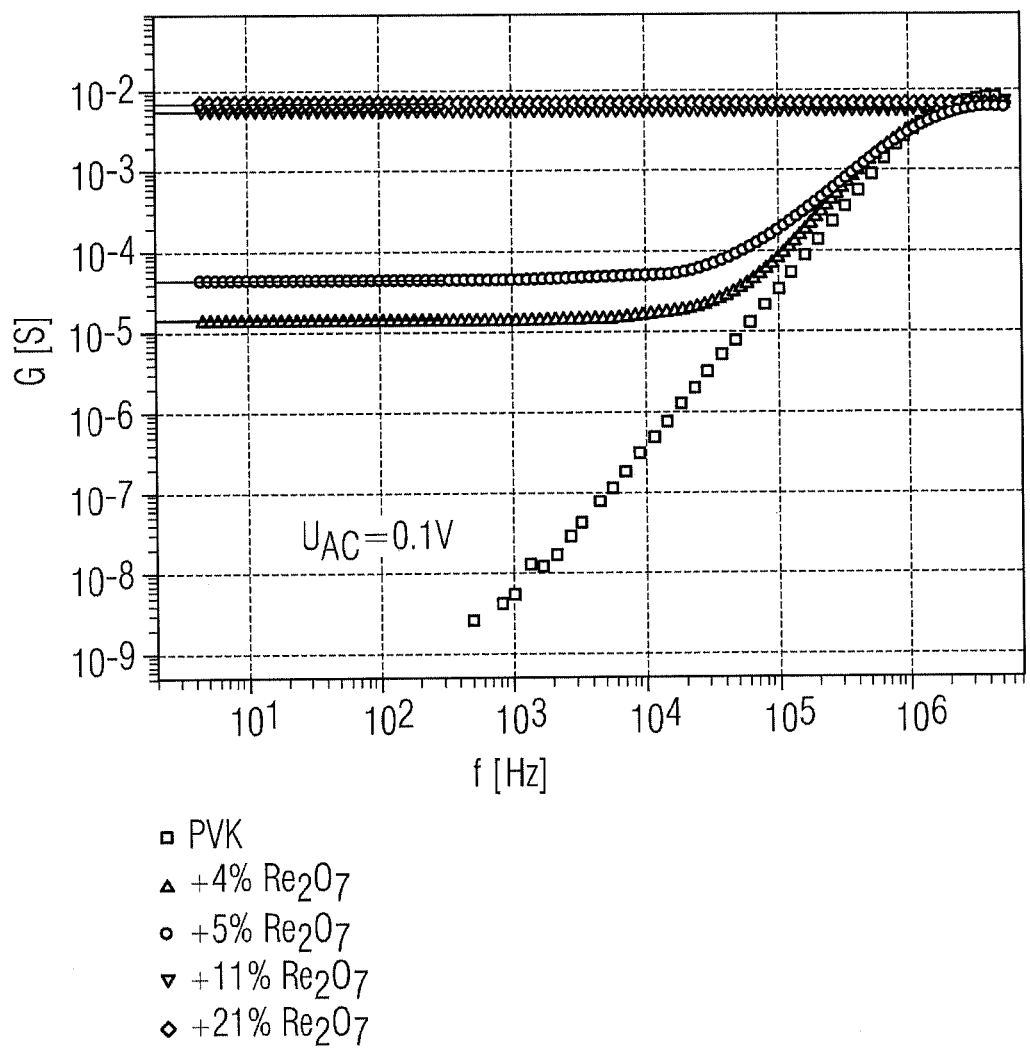
FIG. 2 shows the conductance against frequency measurements of the same constructions as in FIG. 1.

FIG. 2 shows the conductance against frequency measurements of the same constructions as in FIG. 1. It can be seen that in particular at low frequencies the conductance increases by more than 6 orders of magnitude in the case of a doping (example 100 Hz: pure PVK<$10^{-9}$ S, 11% ReOx in PVK>$10^{-3}$ S). The doped layers exhibit purely ohmic behavior because the measured conductances become independent of the frequency.

Figure 3:
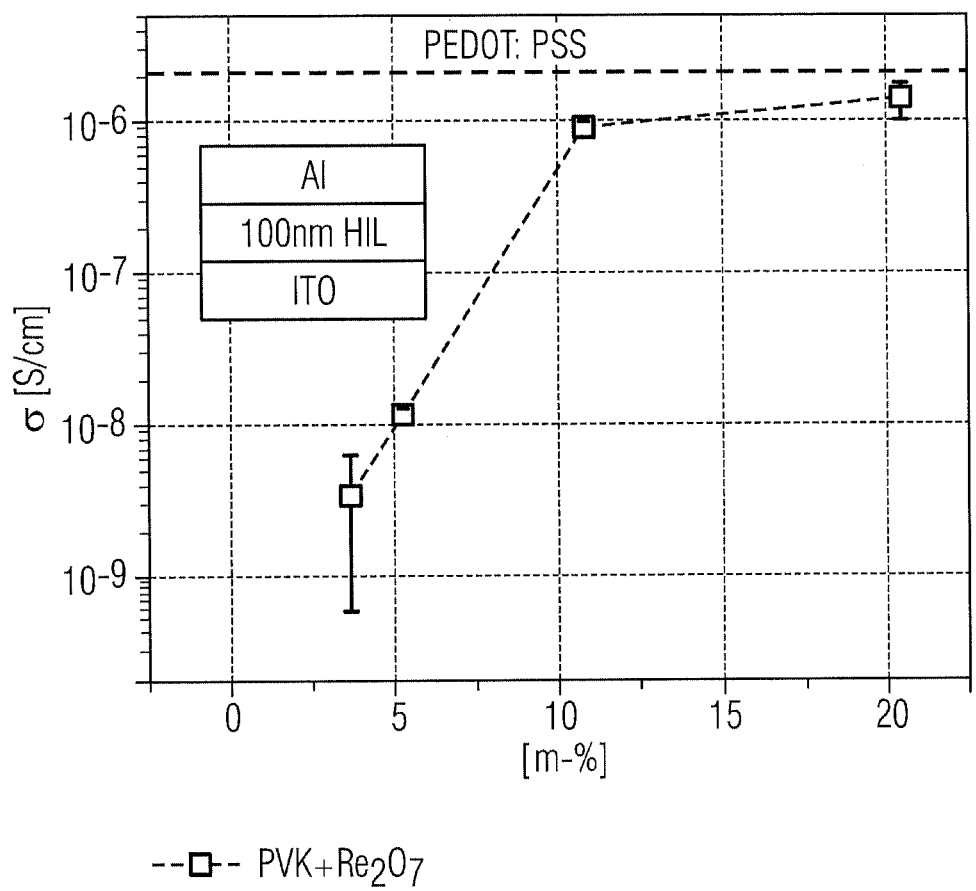
FIG. 3 finally shows the derived characteristics of the conductivity of the construction according to Example 1 with an increasing dopant concentration.

FIG. 3 finally shows the derived characteristics of the conductivity of the construction according to Example 1 with an increasing dopant concentration. The conductivity of the previously known and commonly used hole conductor PEDOT:PSS is given as a reference line. It can be seen that with a dopant concentration of around 20% conductivity values are expected in the region of the PEDOT:PSS.

Figure 4:
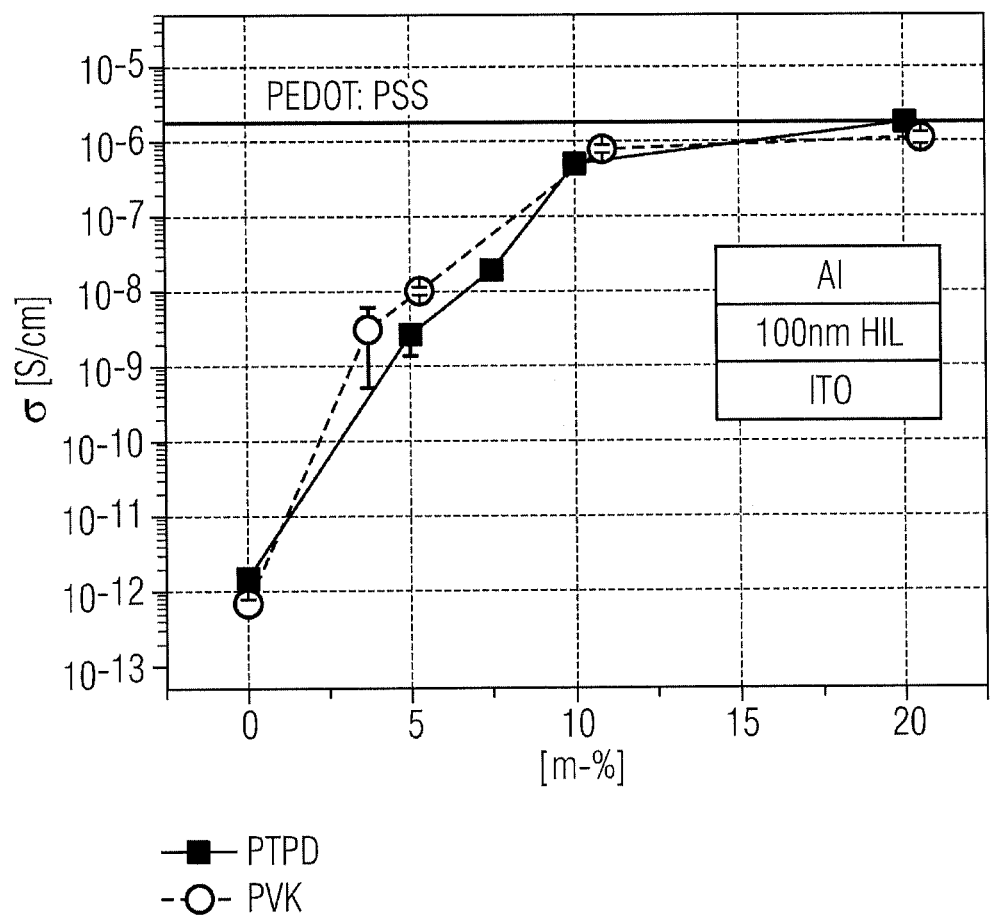
FIG. 4 shows that the choice of the hole transport matrix material has only a slight influence, if any, on the conductivity of the construction of the component.

FIG. 4 shows that the choice of the hole transport matrix material has only a slight influence, if any, on the conductivity of the construction of the component.

Figure 5:
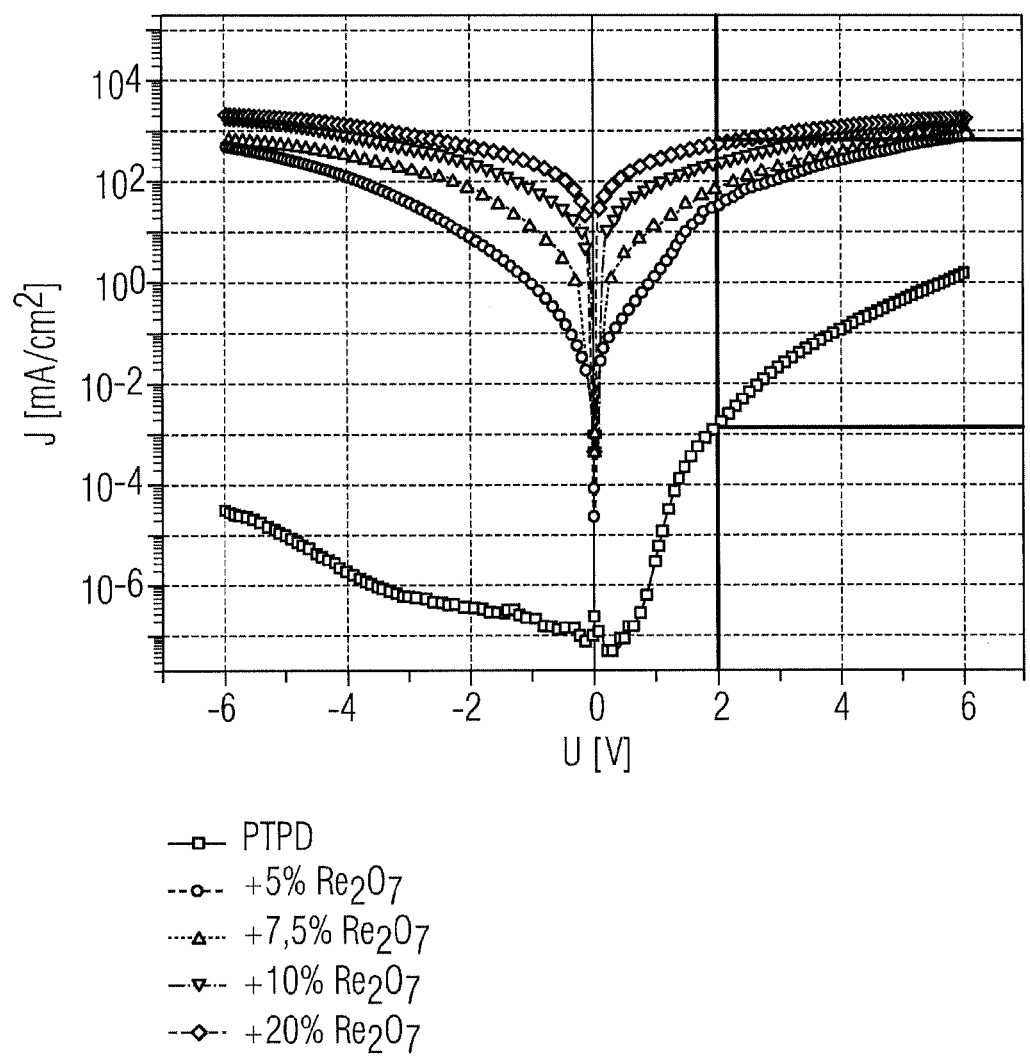
FIG. 5 shows the same measurement as FIG. 1, except that PTPD is used here instead of PVK as the hole transporter matrix material.

FIG. 5 shows the same measurement as FIG. 1, except that PTPD is used here instead of PVK as the hole transporter matrix material. The current/voltage characteristics of 100 nm individual layers of PTPD, doped with 0 to 20% $Re_2O_7$ between an ITO and an aluminum electrode, are shown in FIG. 5. As can be seen, the conductivity of the system can be increased by 3 orders of magnitude by an addition of small quantities of $Re_2O_7$.

Example 2

The solution was produced in similar fashion to Example 1. The mixture was again applied by spin-coating on an electrode layer formed of ITO which is structured and has been washed and subjected to an RIE process. This time the speed of the spin-coating was varied such that layer thicknesses of between 30 and 150 nm resulted. A conventional polymer-based organic light emitting diode (OLED) was then constructed on the layer. To this end, successive layers were applied: firstly a polymeric light-emitting layer which was applied processed from solution from a dry organic solvent. The solvent was removed thermally. Onto this was applied an electron injection layer having a low electron affinity, for example formed of barium, calcium or magnesium, and on this was applied a metallic protective layer having a high electron affinity, for example aluminum or silver. Finally, the device was encapsulated using usual methods.

Example 3

Implementation similar to Example 2, wherein poly(N,N'-bis(4-butylphenyl)-N,N'-bis(phenyl)-benzidine (PTPD) was used as the hole transport matrix material.

To this end, on account of the insolubility of the PTPD in toluene a solvent system comprising chlorobenzene (CB) and THF was used. CB was present in a ratio of 9:1 with THF. The rhenium heptoxide was dissolved in dry THF to begin with and then mixed together with the PTPD in CB.

Figure 6:
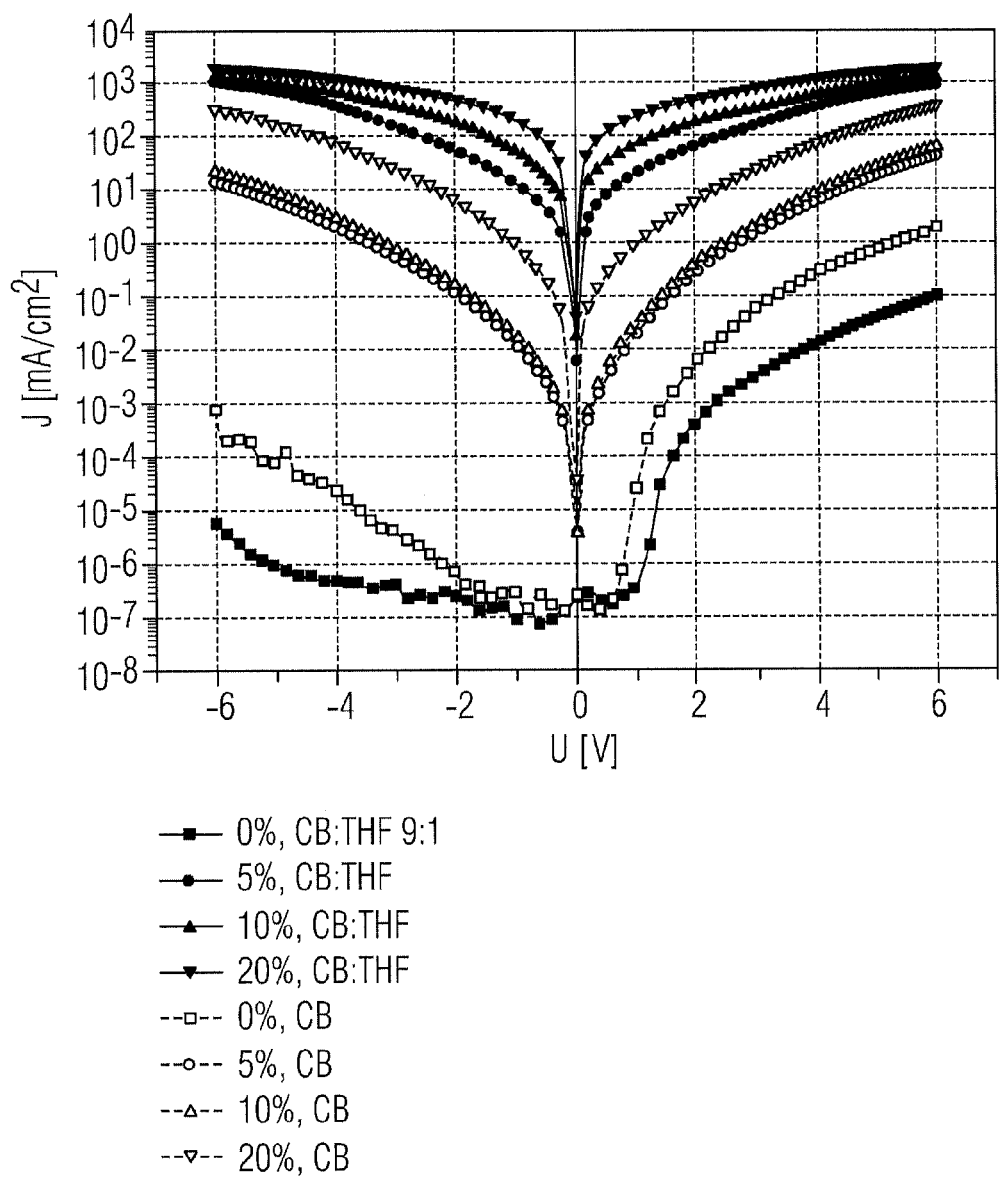
FIG. 6 shows the current/voltage curve for the construction according to Example 1 firstly with a formulation formed of the components hole transport matrix material and doping agent in the solvent CB alone (open symbols) and with a solvent mixture formed of CB and THF (filled symbols)

FIG. 6 shows the current/voltage curve for the construction according to Example 1 firstly with a formulation formed of the components hole transport matrix material and doping agent in the solvent CB alone (open symbols) and with a solvent mixture formed of CB and THF (filled symbols). The two lowermost curves show the matrix material PTBD on the one hand dissolved in CB alone (open boxes) and on the other hand dissolved in the solvent mixture CB with THF (filled boxes). The result is identical to that described in FIG. 1 because it has also been shown here that the highest doping level at approximately 20% $Re_2O_7$ in a stable matrix (filled downward pointing triangles) has the best (uppermost) current/voltage curve.

In this situation, it should not go unmentioned that the solution of PTPD and $Re_2O_7$ in chlorobenzene alone is not stable. In this case, a precipitate drops out of the solution and the doping is only limited in extent or is not accomplished at all. Furthermore, if the doping reaction does not take place or takes place only to a limited extent, the IN (current/voltage curve) characteristics are not symmetrical because the hole transport is prevented by the aluminum cathode. In addition, the current is lower compared with the doped systems because only a limited number of charge carriers are present.

Example 4

Figure 7:
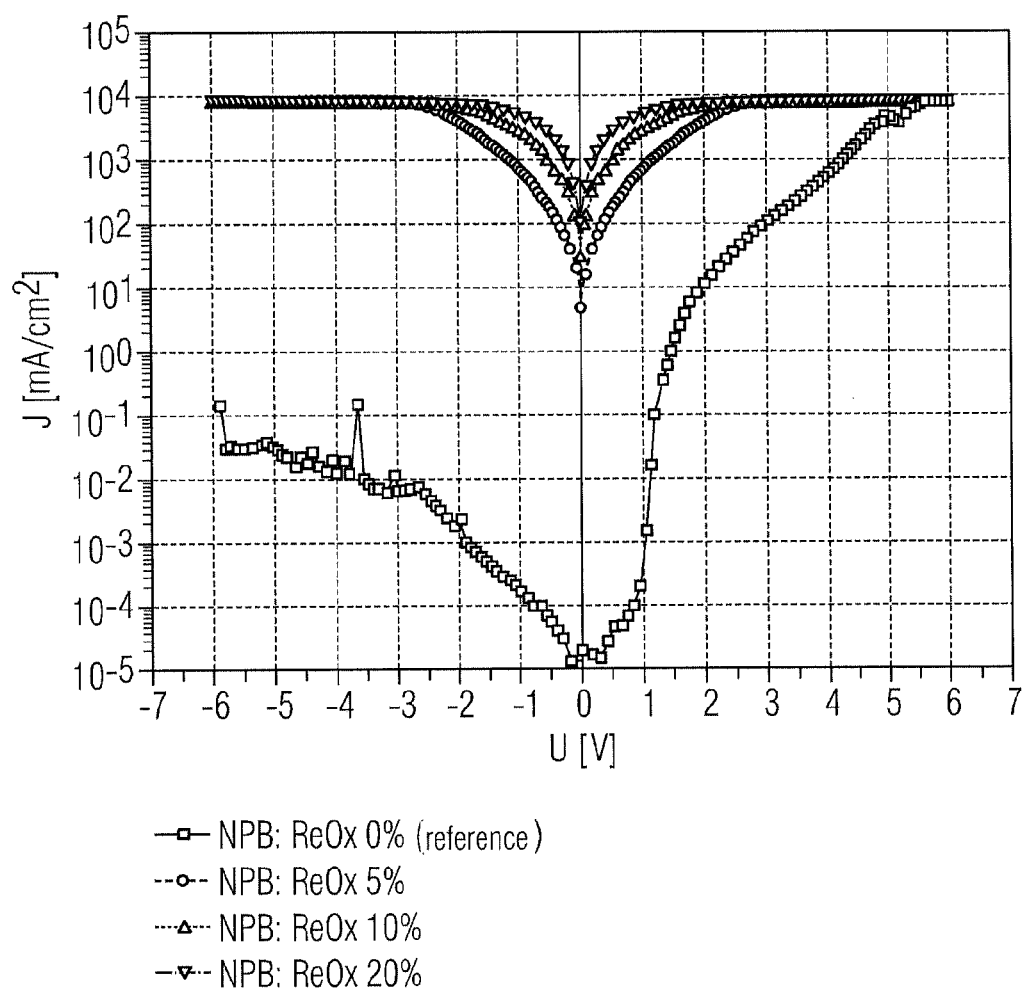
FIG. 7 shows the current/voltage curve of the construction according to Example 1, in other words of the single layer between two electrodes formed of ITO and aluminum.

Comparison of NPB applied by way of the vapor phase as a typical representative of the small molecules according to the related art (FIG. 7) and NPB processed from solution (FIG. 8), both doped with the quantity in the range from 0 to 20% $Re_2O_7$. FIG. 7 shows the current/voltage curve of the construction according to Example 1, in other words of the single layer between two electrodes formed of ITO and aluminum. In order to examine the influence of the production method on the performance, measurement was carried out here between the electrodes on a 60 nm single layer formed of thermally vapor deposited NPB with a $Re_2O_7$ doping in the range from 0 to 20% instead of on the polymer layer processed from solution.

Figure 8:
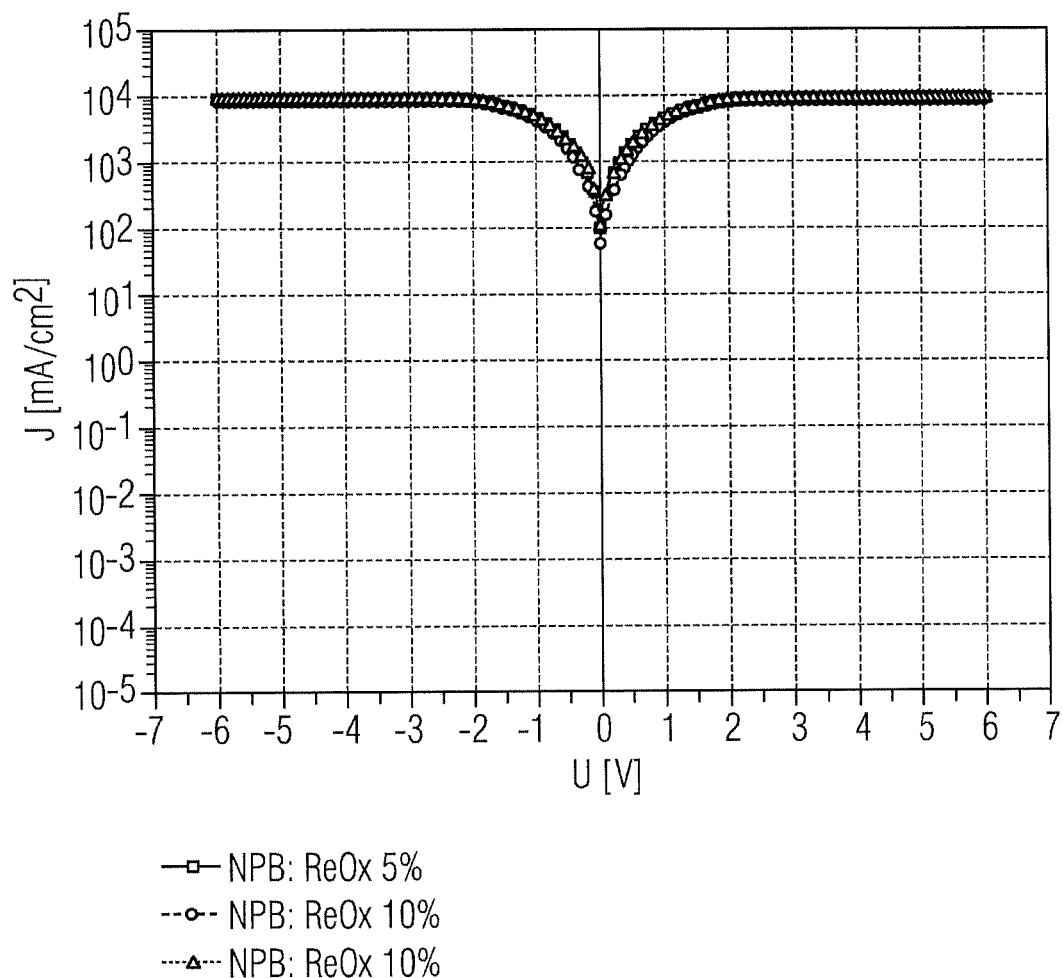
FIG. 8 shows the same construction and the same measurement with the 60 nm single layer formed of NPB processed from solution, in this case applied by spin-coating, between ITO and aluminum again with dopings of 5 and 10% Re$_2$O$_7$.
Figure 9:
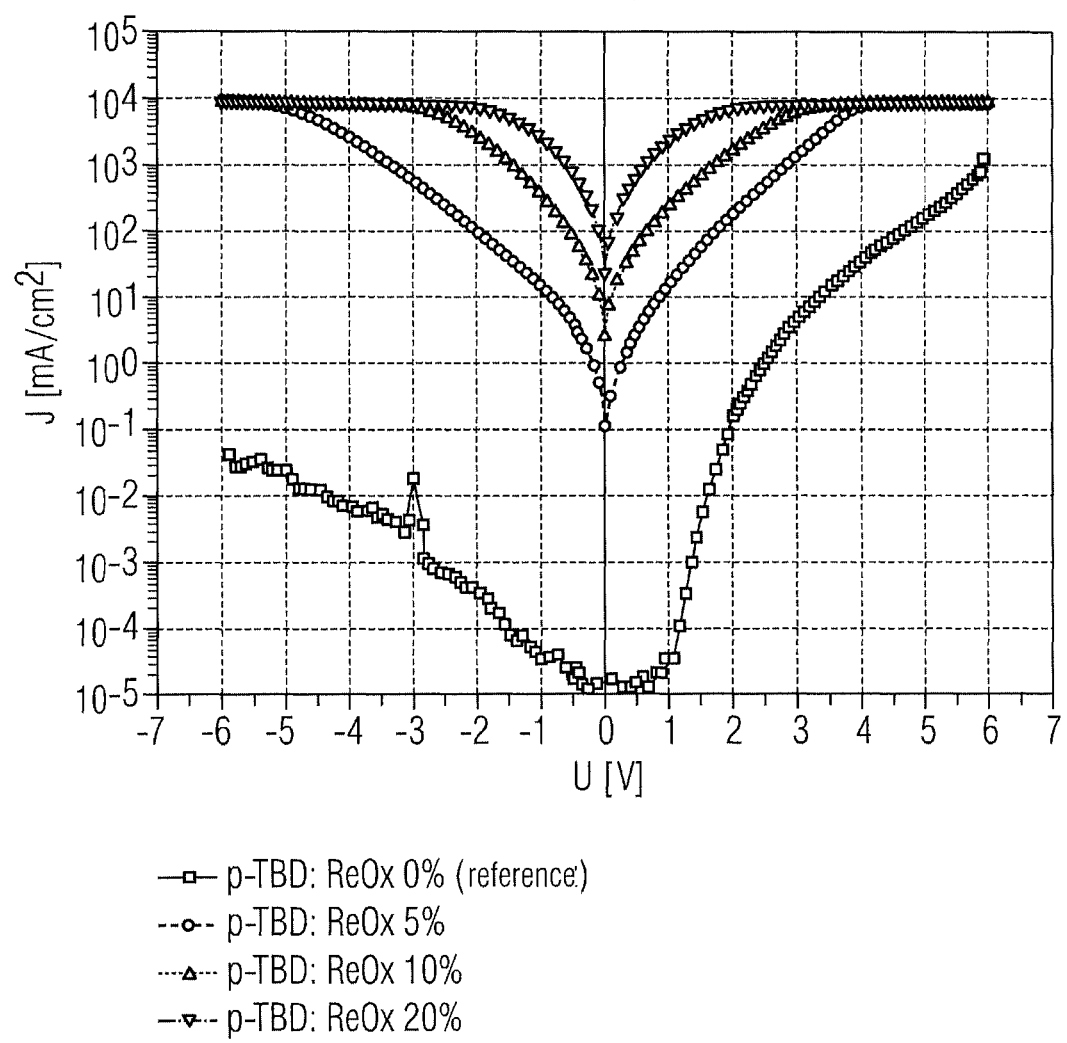
FIG. 9 shows current voltage curves at ReOx concentrations of 0%, 5%, 10% and 20%.

FIG. 8 shows the same construction and the same measurement with the 60 nm single layer formed of NPB processed from solution, in this case applied by spin-coating, between ITO and aluminum again with dopings of 5 and 10% $Re_2O_7$.

Compared with the FIGS. 5 and 6 from Examples 1 and 2 respectively, it can be seen that neither the hole transporter matrix material nor the production method (whether processed from solution or not) influences the doping mechanism.

Example 5

Similar to Example 2, hole transport matrix material is poly(3-hexylthiophene) (P3HT).

Example 6

Similar to Example 2, hole transport matrix material is poly(3,4-ethylenedioxythiophene (PEDOT).

Example 7

Similar to Example 2, hole transport matrix material is polyaniline (PANI).

Example 8

One of the hole transport layers from one of the Examples 2 to 6 is produced in accordance with Example 2. The subsequent layers are deposited from the vapor phase, wherein materials based on small molecules are used. The emitting layer(s), electron injection layer(s) and the cathode are applied using the known sequence and technology.

Example 9

One of the hole transport layers from one of the Examples 2 to 6 is produced in accordance with Example 2. Instead of the spin-coating, printing methods are used in order to produce the hole transport layer processed from solution and the subsequent layers. Doctor blading, screen printing, gravure printing, inkjet printing, flexo printing or offset printing were used as printing methods.

Example 10

Similar to Example 9, wherein as in Example 8 the subsequent layers are deposited from the vapor phase, wherein materials based on small molecules are used. The emitting layer(s), electron injection layer(s) and the cathode are applied using the known sequence and technology.

Example 11

The OLED/PLED is constructed as a top-emitting OLED, wherein the layer stack is built on the cathode.

Example 12

Figure 10:
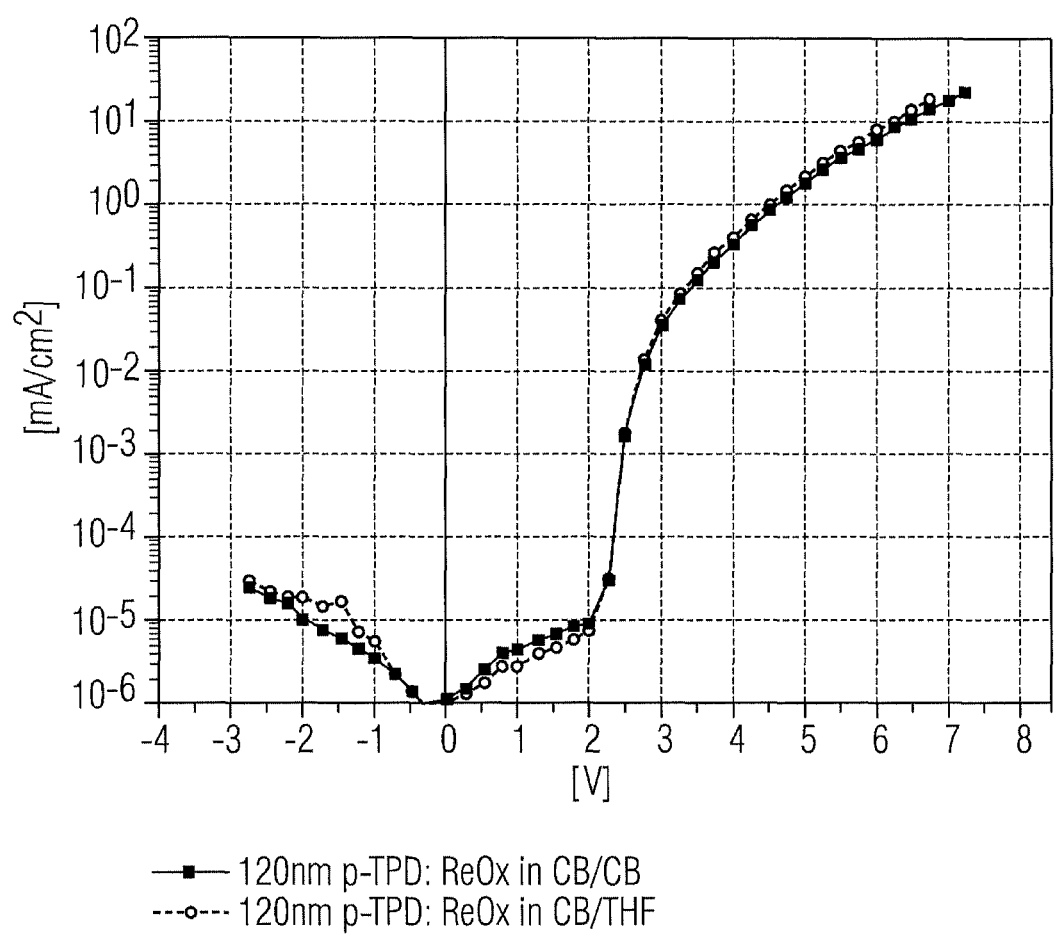
FIG. 10 shows a current/voltage curve of a white light emitting diode which is equipped with a 120 nm thick p-TPD-based hole transport layer applied by spin-coating and doped with 7.5% Re$_2$O$_7$.

FIG. 10 shows a current/voltage curve of a white light emitting diode which is equipped with a 120 nm thick p-TPD-based hole transport layer applied by spin-coating and doped with 7.5% $Re_2O_7$. On this p-TPD:ReOx (7.5%) layer is located a layer stack formed of vapor-deposited small molecules. The small molecule layers comprise phosphorescent red and green and fluorescent blue emitter layers. The graph with the filled symbols shows the behavior of the 120 nm layer formed of p-TPD and ReOx both applied from a CB solution without further solvents and the graph with the open symbols shows the same layer which was produced from a solution of the components in CB and THF. A difference apparently results depending on the form in which the solution is processed, whether from a solvent or from a solvent mixture. The difference in the characteristic curves is illustrated in the linear plot of the current/voltage characteristic curves, as shown in use in FIG. 10.

Figure 11:
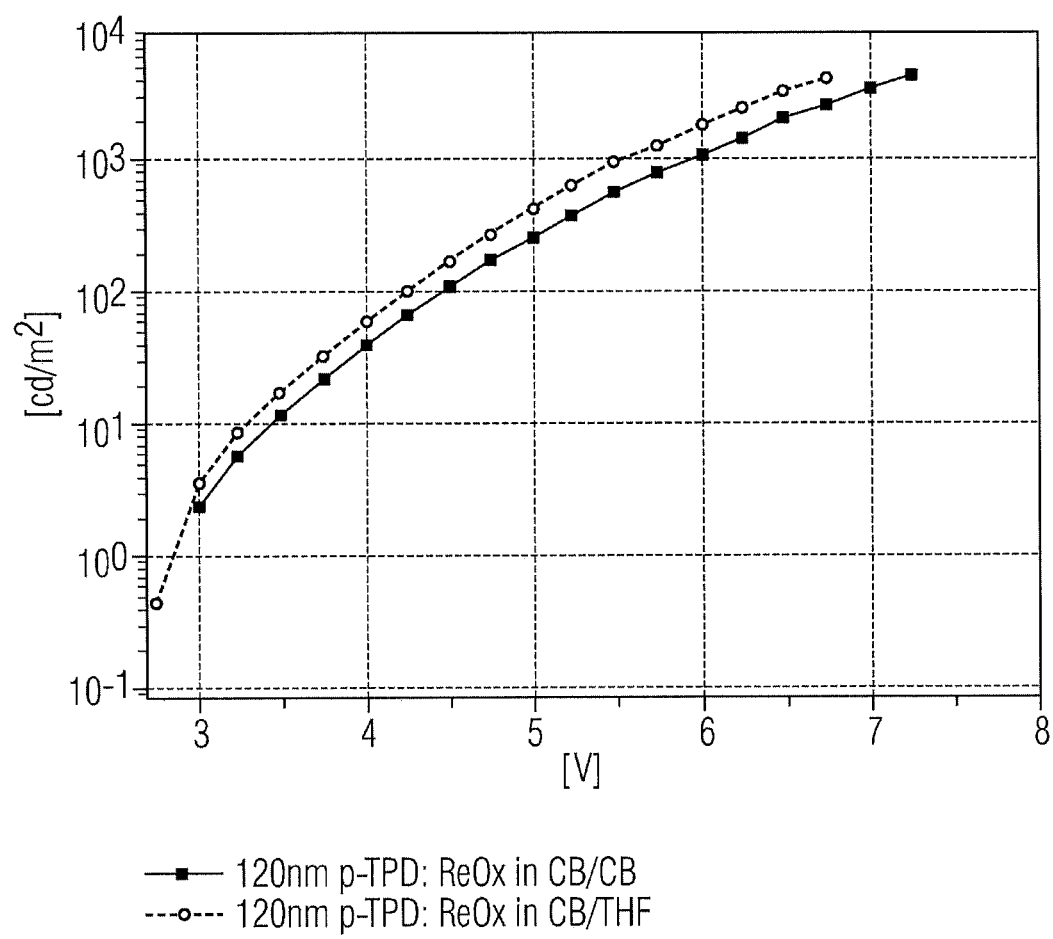
FIG. 11 shows the associated luminance against voltage measurement of the white emitting OLED having a 120 nm thick hole transport layer formed of p-TPD:ReOx (7.5%)

The higher current in the case of the diodes having the layer formed of PTPD and ReOX produced from a solvent mixture achieves a higher light output. FIG. 11 shows the associated luminance against voltage measurement of the white emitting OLED having a 120 nm thick hole transport layer formed of p-TPD:ReOx (7.5%). Again, the curve for the diodes processed from a solution comprising CB and THF (open symbols) lies above the curve which has been processed from a pure CB solution (filled symbols).

Figure 12:
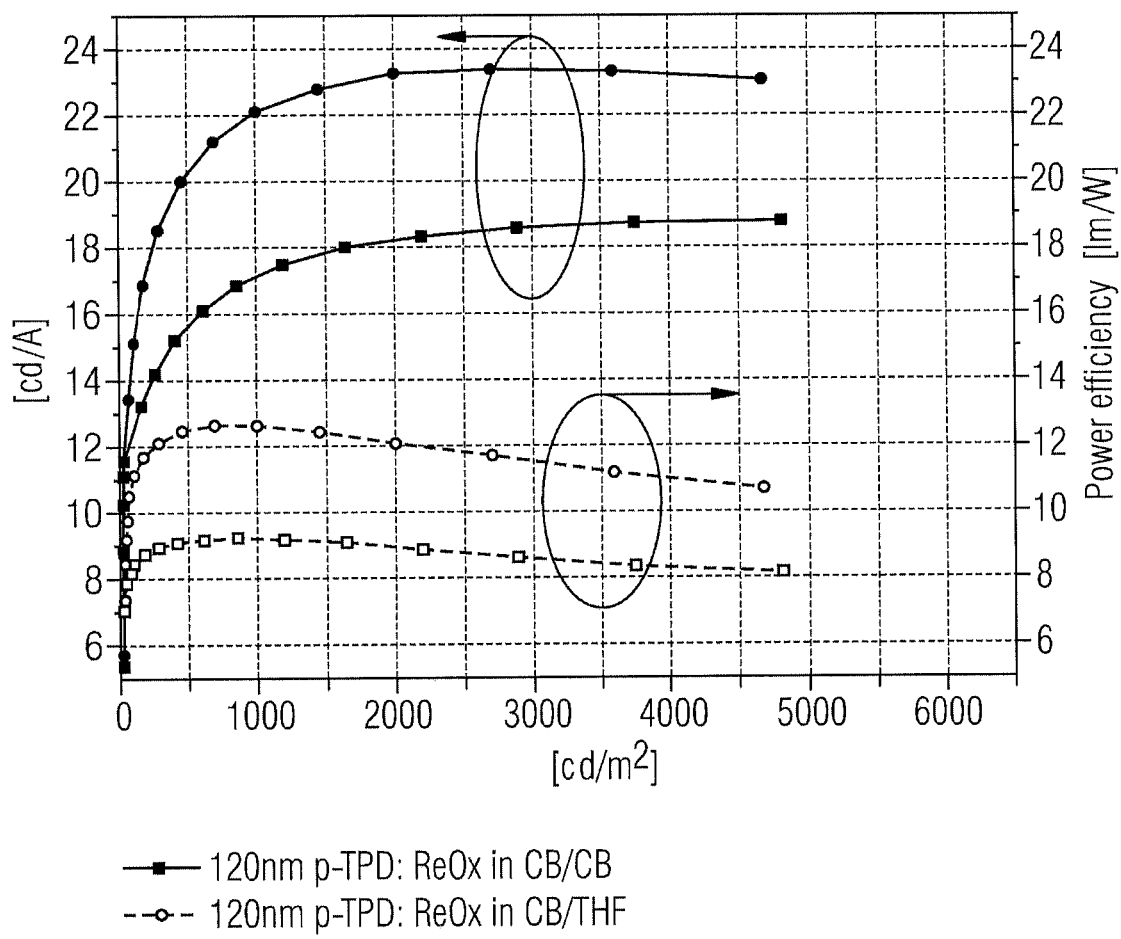
FIG. 12 shows the current efficiency (cd/A) and power efficiency measurement in lm/W against luminance in cd/m2.

FIG. 12 shows the current efficiency (cd/A) and power efficiency measurement in lm/W against luminance in cd/m2. The two constructions compared are those already known from FIGS. 10 and 11, wherein the filled symbols again show the layers processed from a pure CB solution and the open symbols show the layers wherein the rhenium compound was processed dissolved in THF and the hole transport matrix material was processed dissolved in CB. It can be clearly seen that the diodes processed from a solvent mixture are more efficient than the diodes produced from a pure CB solution.

Figure 13:
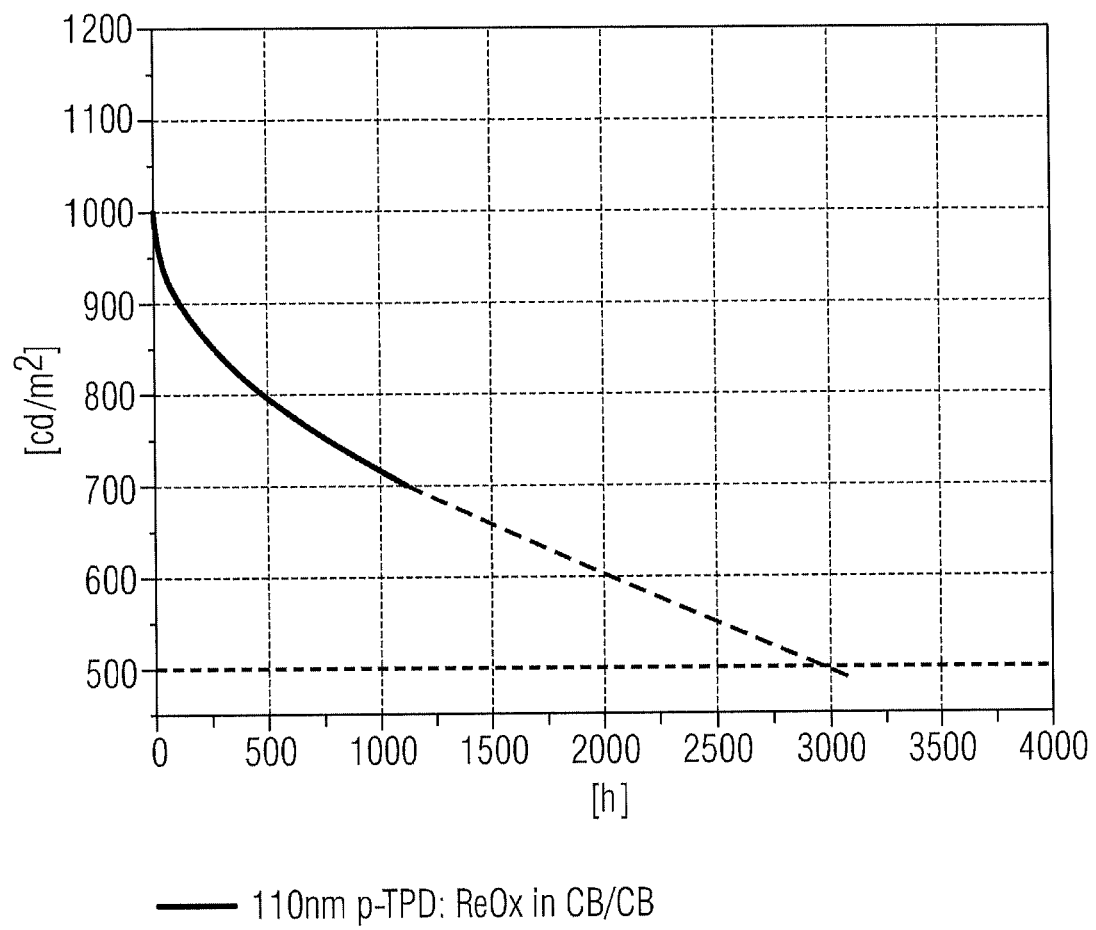
FIG. 13 shows the long-term stability of the white OLED having a 120 nm thick p-TPD-ReOx (7.5%) hole transport layer applied by spin-coating.

FIG. 13 shows the long-term stability of the white OLED having a 120 nm thick p-TPD-ReOx (7.5%) hole transport layer applied by spin-coating. P-TPD and ReOx were processed both dissolved in CB for the layer.

The use of rhenium heptoxide in organic light emitting diodes as a p-doping agent processable from solution is proposed for the first time by the inventors.

This results in the following advantages:
A more stable p-doping in organic light emitting diodes.
A more efficient hole transport layer results in a higher luminance and a lower operating voltage and thereby in a greater efficiency of the organic light emitting diode.
The service life of the organic light emitting diode is thus increased.

This moreover results in independence from ITO as a single anode material as well as a cost-effective production method resulting from solution processing. Moreover, this gives access to rhenium oxides which are present in low oxidation states, which leads to a change and improvement in the appearance of the OLED in the off-state. Finally, rhenium precursors which are suitable for formulations processable from solution are created and lastly there results a lower sensitivity to moisture of the formulations on account of the use of coordinatively saturated rhenium components.

It is proposed to process a metal component in solution with the hole transport matrix material in solution to a hole transport layer.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV,* 69 USPQ2d 1865 (Fed. Cir. 2004).

The invention claimed is:

1. A solution to form a hole transport layer, the solution comprising:
   a solvent;
   a hole transporter matrix material dissolved in the solvent; and
   a metallic doping agent dissolved in the solvent, the doping agent having a metallic central atom that can form a charge transfer complex with the matrix material wherein
   the doping agent is selected from the group consisting of molybdenum oxides, tungsten oxides, vanadium oxides and rhenium oxides.

2. The solution according to claim 1, wherein the matrix material is formed from at least one non-polymeric hole transporter selected from the group consisting of N,N'-bis(naphthalen-1-yl)-N,N'-bis(phenyl)-9,9-dimethyl-fluorene, N,N'-bis(3-methylphenyl)-N,N'-bis(phenyl)-9,9-diphenyl-fluorene, N,N'-bis(naphthalen-1-yl)-N,N'-bis(phenyl)-9,9-diphenyl-fluorene, N,N'-bis(naphthalen-1-yl)-N,N'-bis(phenyl)-2,2-dimethylbenzidine, N,N'-bis(3-methylphenyl)-N,N'-bis(phenyl)-9,9-spirobifluorene, 2,2',7,7'-tetrakis(N,N-diphenylamino)-9,9'-spirobifluorene, N,N'-bis(naphthalen-1-yl)-N,N'-bis(phenyl)-benzidine, N,N'-bis(naphthalen-2-yl)-N,N'-bis(phenyl)-benzidine, N,N'-bis(3-methylphenyl)-N,N'-bis(phenyl)-benzidine, N,N'-bis(3-methylphenyl)-N,N'-bis(phenyl)-9,9-dimethyl-fluorene, N,N'-bis(naphthalen-1-yl)-N,N'-bis(phenyl)-9,9-spirobifluorene, di-[4-(N,N-ditolyl-amino)-phenyl]cyclohexane, 2,2',7,7'-tetra(N,N-ditolyl)amino-spiro-bifluorene, 9,9-bis[4-(N,N-bis-biphenyl-4-yl-amino)phenyl]-9H-fluorene, 2,2',7,7'-tetrakis[N-naphthalenyl(phenyl)-amino]-9,9-spirobifluorene, 2,7-bis[N,N-bis(9,9-spiro-bifluorene-2-yl)-amino]-9,9-spirobifluorene, 2,2'-bis[N,N-bis(biphenyl-4-yl)amino]-9,9-spirobifluorene, N,N'-bis(phenanthren-9-yl)-N,N'-bis(phenyl)-benzidine, N,N,N',N'-tetra-naphthalen-2-yl-benzidine, 2,2'-bis(N,N-di-phenyl-amino)-9,9-spirobifluorene, 9,9-bis[4-(N,N-bis-naphthalen-2-yl-amino)phenyl]-9H-fluorene, 9,9-bis[4-(N,N-bis-naphthalen-2-yl-N,N'-bis-phenyl-amino)-phenyl]-9H-fluorene, titanium oxide phthalocyanine, copper phthalocyanine, 2,3,5,6-tetrafluoro-7,7,8,8,-tetracyano-quinodimethane, 4,4',4"-tris(N-3-methylphenyl-N-phenyl-amino)triphenylamine, 4,4',4"-tris(N-(2-naphthyl)-N-phenyl-amino)triphenylamine, 4,4',4"-tris(N-(1-naphthyl)-N-phenyl-amino)triphenylamine, 4,4',4"-tris(N,N-diphenyl-amino)triphenylamine, pyrazino[2,3-f][1,10]phenanthroline-2,3-dicarbonitrile, N,N,N',N'-tetrakis(4-methoxyphenyl)benzidine, 2,7-bis[N,N-bis(4-methoxy-phenyl)amino]-9,9-spirobifluorene, 2,2'-bis[N,N-bis(4-methoxy-phenyl)amino]-9,9-spirobifluorene, N,N'-di(naphthalen-2-yl)-N,N'-diphenylbenzene-1,4-diamine, N,N'-di-phenyl-N,N'-di-[4-(N,N-di-tolyl-amino)phenyl]benzidine, N,N'-di-phenyl-N,N'-di-[4-(N,N-di-phenyl-amino)phenyl]benzidine, and N'-diphenyl-N,N'-bis[1-naphthyl-1,1'-biphenyl]-4,4'-diamine (NBP).

3. The solution according to claim 1, wherein the matrix material is formed from at least one polymeric hole transporter selected from the group consisting of (poly-(3,4-ethylenedioxythiophene) (PEDOT), polyvinylcarbazole (PVK), poly(N,N'-bis,(4-butylphenyl)-N,N'-bis(phenyl)benzidine (PTPD), polyaniline (PANI), poly(3-hexylthiophene) (P3HT) and copolymers thereof.

4. The solution according to claim 1, wherein the matrix material is formed from a combination of poly(N,N'-bis,(4-butylphenyl)-N,N'-bis(phenyl)benzidine (PTPD) and N'-diphenyl-N,N'-bis[1-naphthyl-1,1-biphenyl]-4,4'-diamine (NPB).

5. The solution according to claim 1, wherein the doping agent is rhenium heptoxide ($Re_2O_7$).

6. The solution according to claim 1, wherein
   the matrix material is formed from a combination of poly (N,N'-bis,(4-butylphenyl)-N,N'-bis(phenyl)benzidine (PTPD) and N'-diphenyl-N,N'-bis[1-naphthyl-1,1-biphenyl]-4,4'-diamine (NPB), and
   the doping agent is rhenium heptoxide ($Re_2O_7$).

7. The solution as claimed in claim 1, wherein a mixture of solvents are used to form the solution.

8. The solution as claimed in claim 1, wherein the solution contains the charge transfer complex of the metal central element with the matrix material.

9. A method for producing a hole transport layer, comprising:
   applying a solution onto a lower electrode layer, the solution containing a hole transporter matrix material and a doping agent compound, both dissolved in a solvent, the doping agent compound having a metallic central atom; and
   after applying the solution, removing the solvent by thermolysis such that the metallic central atom forms a charge transfer complex with the matrix material to transport positive charges, wherein
   the doping agent is selected from the group consisting of molybdenum oxides, tungsten oxides, vanadium oxides and rhenium oxides.

10. The method according to claim 9, wherein the matrix material is formed from at least one non-polymeric hole transporter selected from the group consisting of N,N'-bis(naphthalen-1-yl)-N,N'-bis(phenyl)-9,9-dimethyl-fluorene, N,N'-bis(3-methylphenyl)-N,N'-bis(phenyl)-9,9-diphenyl-fluorene, N,N'-bis(naphthalen-1-yl)-N,N'-bis(phenyl)-9,9-diphenyl-fluorene, N,N'-bis(naphthalen-1-yl)-N,N'-bis(phenyl)-2,2-dimethylbenzidine, N,N'-bis(3-methylphenyl)-N,N'-bis(phenyl)-9,9-spirobifluorene, 2,2',7,7'-tetrakis(N,N-diphenylamino)-9,9'-spirobifluorene, N,N'-bis(naphthalen-1-yl)-N,N'-bis(phenyl)-benzidine, N,N'-bis(naphthalen-2-yl)-N,N'-bis(phenyl)-benzidine, N,N'-bis(3-methylphenyl)-N,N'-bis(phenyl)-benzidine, N,N'-bis(3-methylphenyl)-N,N'-bis(phenyl)-9,9-dimethyl-fluorene, N,N'-bis(naphthalen-1-yl)-N,N'-bis(phenyl)-9,9-spirobifluorene, di-[4-(N,N-ditolyl-amino)-phenyl]cyclohexane, 2,2',7,7'-tetra(N,N-ditolyl)amino-spiro-bifluorene, 9,9-bis[4-(N,N-bis-biphenyl-4-yl-amino)phenyl]-9H-fluorene, 2,2',7,7'-tetrakis[N-naphthalenyl(phenyl)-amino]-9,9-spirobifluorene, 2,7-bis[N,N-bis(9,9-spiro-bifluorene-2-yl)-amino]-9,9-spirobifluorene, 2,2'-bis[N,N-bis(biphenyl-4-yl)amino]-9,9-spirobifluorene, N,N'-bis(phenanthren-9-yl)-N,N'-bis(phenyl)-benzidine, N,N,N',N'-tetra-naphthalen-2-yl-benzidine, 2,2'-bis(N,N-di-phenyl-amino)-9,9-spirobifluorene, 9,9-bis[4-(N,N-bis-naphthalen-2-yl-amino)phenyl]-9H-fluorene, 9,9-bis[4-(N,N-bis-naphthalen-2-yl-N,N'-bis-phenyl-amino)-phenyl]-9H-fluorene, titanium oxide phthalocyanine, copper phthalocyanine, 2,3,5,6-tetrafluoro-7,7,8,8,-tetracyano-quinodimethane, 4,4',4"-tris(N-3-methylphenyl-N-phenyl-amino)triphenylamine, 4,4',4"-tris(N-(2-naphthyl)-N-phenyl-amino)triphenylamine, 4,4',4"-tris(N-(1-naphthyl)-N-phenyl-amino)triphenylamine, 4,4',4"-tris(N,N-diphenyl-amino)triphenylamine, pyrazino

[2,3-f][1,10]phenanthroline-2,3-dicarbonitrile, N,N,N',N'-tetrakis(4-methoxyphenyl)benzidine, 2,7-bis[N,N-bis(4-methoxy-phenyl)amino]-9,9-spirobifluorene, 2,2'-bis[N,N-bis(4-methoxy-phenyl)amino]-9,9-spirobifluorene, N,N'-di(naphthalen-2-yl)-N,N'-diphenylbenzene-1,4-diamine, N,N'-di-phenyl-N,N'-di-[4-(N,N-di-tolyl-amino)phenyl]benzidine, N,N'-di-phenyl-N,N'-di-[4-(N,N-di-phenyl-amino)phenyl]benzidine, and N'-diphenyl-N,N'-bis[1-naphthyl-1,1'-biphenyl]-4,4'-diamine (NBP).

11. The method according to claim 9, wherein the matrix material is formed from at least one polymeric hole transporter selected from the group consisting of (poly-(3,4-ethylenedioxythiophene) (PEDOT), polyvinylcarbazole (PVK), poly(N,N'-bis,(4-butylphenyl)-N,N'-bis(phenyl)benzidine (PTPD), polyaniline (PANI), poly(3-hexylthiophene) (P3HT) and copolymers thereof.

12. The method according to claim 9, wherein the matrix material is formed from a combination of poly(N,N'-bis,(4-butylphenyl)-N,N'-bis(phenyl)benzidine (PTPD) and N'-diphenyl-N,N'-bis[1-naphthyl-1,1'-biphenyl]-4,4'-diamine (NPB).

13. The method according to claim 9, wherein the doping agent is rhenium heptoxide ($Re_2O_7$).

14. The method according to claim 9, wherein
the matrix material is formed from a combination of poly(N,N'-bis,(4-butylphenyl)-N,N'-bis(phenyl)benzidine (PTPD) and N'-diphenyl-N,N'-bis[1-naphthyl-1,1'-biphenyl]-4,4'-diamine (NPB), and
the doping agent is rhenium heptoxide ($Re_2O_7$).

\* \* \* \* \*

UNITED STATES PATENT AND TRADEMARK OFFICE
CERTIFICATE OF CORRECTION

PATENT NO.        : 8,610,113 B2
APPLICATION NO.   : 13/321762
DATED             : December 17, 2013
INVENTOR(S)       : Hartmann et al.

It is certified that error appears in the above-identified patent and that said Letters Patent is hereby corrected as shown below:

In the Claims:

Column 13, Line 14, In Claim 1, delete "material" and insert -- material, --, therefor.
Column 14, Line 4, In Claim 4, delete "1-biphenyl]" and insert -- 1'-biphenyl] --, therefor.
Column 14, Lines 11-12, In Claim 6, delete "1-biphenyl]" and insert -- 1'-biphenyl] --, therefor.

Signed and Sealed this
Twenty-fifth Day of March, 2014

Michelle K. Lee
*Deputy Director of the United States Patent and Trademark Office*